United States Patent [19]

Olsen

[11] Patent Number: 4,924,964

[45] Date of Patent: May 15, 1990

[54] LOUDSPEAKER ENCLOSURE

[76] Inventor: Michael P. Olsen, 3727 46th Ave. S., Minneapolis, Minn. 55406

[21] Appl. No.: 384,669

[22] Filed: Jul. 24, 1989

[51] Int. Cl.[5] .......... H05K 5/00

[52] U.S. Cl. .......... 181/151; 181/146; 181/153; 181/156; 181/199; 381/158

[58] Field of Search .......... 181/146, 147, 148, 151, 181/153, 156, 160, 199; 381/158, 159

[56] References Cited

U.S. PATENT DOCUMENTS

| | | | |
|---|---|---|---|
| 1,869,178 | 7/1932 | Thurus | 181/160 |
| 3,430,728 | 3/1969 | Aunning | 181/151 X |
| 3,638,753 | 2/1970 | Cunningham | 181/153 |
| 3,884,326 | 5/1975 | Orisek | 181/155 |
| 3,912,865 | 10/1975 | Seebinger | 381/124 |
| 3,945,461 | 3/1976 | Robinson | 181/153 |
| 3,978,941 | 9/1976 | Siebert | 181/151 |
| 4,127,751 | 11/1978 | Kinoshita | 181/146 X |
| 4,169,516 | 10/1979 | Honda | 181/153 |
| 4,270,023 | 5/1981 | Beveridge | 381/188 |
| 4,284,844 | 8/1981 | Belles | 181/151 X |
| 4,298,087 | 11/1981 | Launay | 181/153 |
| 4,349,084 | 9/1982 | Karpodines | 181/146 |
| 4,567,959 | 2/1986 | Prophit | 181/156 |
| 4,580,654 | 4/1986 | Hale | 181/146 |
| 4,591,020 | 5/1986 | Hruby, Jr. | 181/145 |
| 4,655,315 | 4/1987 | Saville | 181/153 |
| 4,673,149 | 6/1987 | Grote et al. | 248/343 |
| 4,730,694 | 3/1988 | Alberino | 181/153 |
| 4,756,382 | 7/1988 | Hudson, III | 181/156 |
| 4,802,551 | 2/1989 | Jacobsen | 181/146 |

FOREIGN PATENT DOCUMENTS

| | | | |
|---|---|---|---|
| 0348985 | 11/1960 | Fed: Rep. of Germany | 181/156 |
| 0284196 | 12/1986 | Japan | 381/159 |
| 0467279 | 6/1937 | United Kingdom | 181/160 |
| 0496487 | 11/1938 | United Kingdom | 181/151 |

*Primary Examiner*—B. R. Fuller

*Attorney, Agent, or Firm*—Kinney & Lange

[57] ABSTRACT

An enclosure for a bass loudspeaker for housing in a larger multiple loudspeaker enclosure having a pair of concentric cylindrical shells filled with dense particulate matter.

7 Claims, 3 Drawing Sheets

Fig. 2
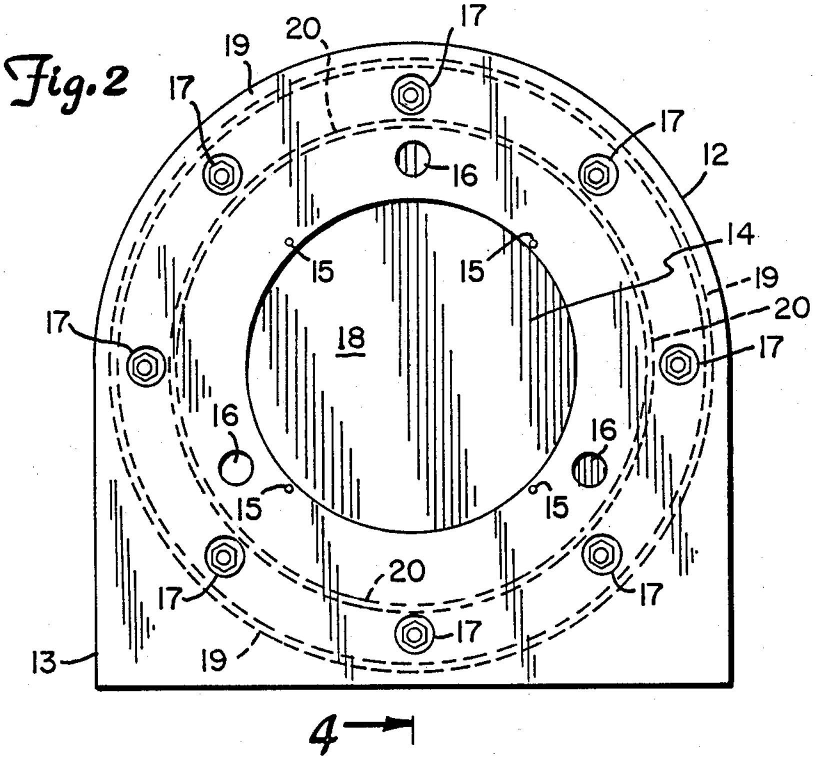
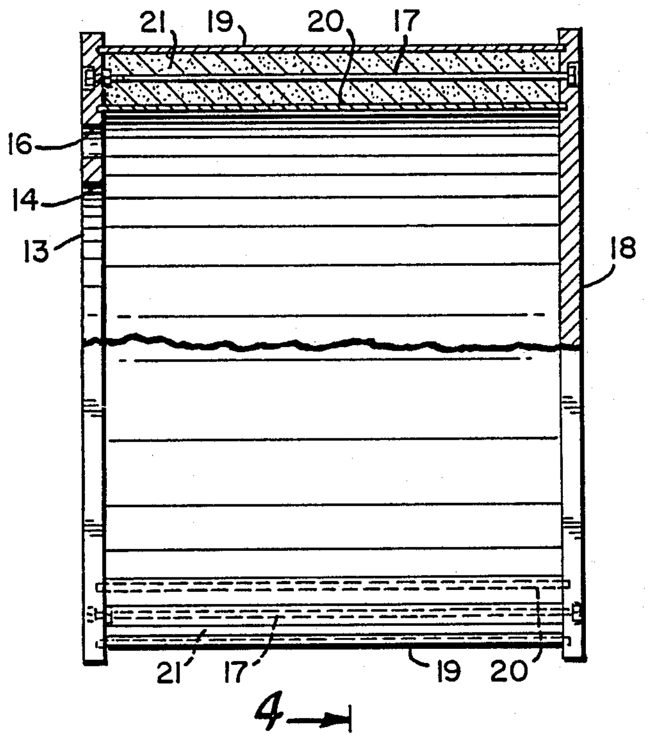
Fig. 3

Fig. 4
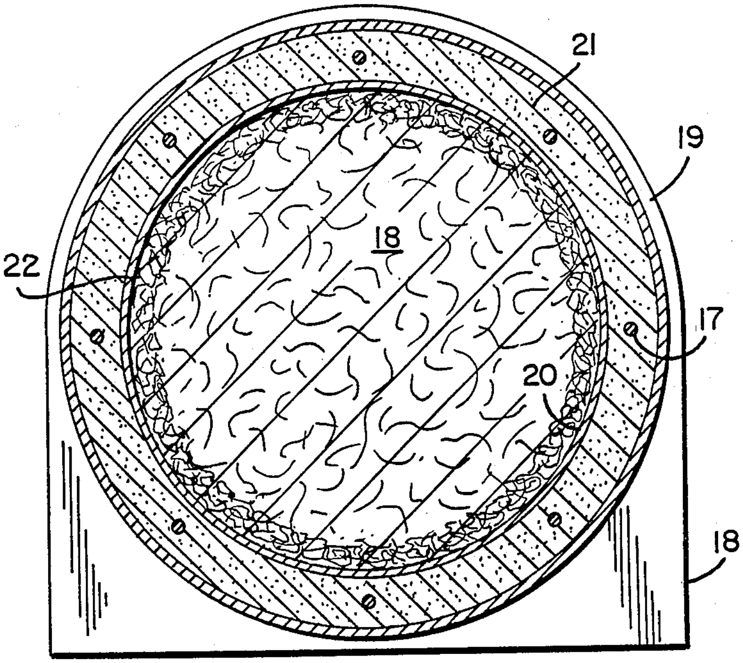
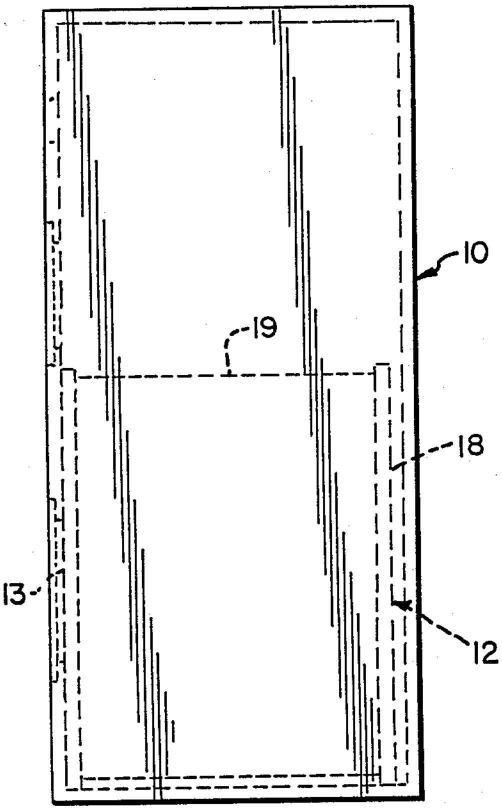
Fig. 5

LOUDSPEAKER ENCLOSURE

BACKGROUND OF THE INVENTION

The present invention relates to enclosures in which a corresponding loudspeaker is to be mounted and, more particularly, to enclosures in which loudspeakers for responding to low frequency electrical energization are to be mounted to provide sound in the bass audio range.

As is well known, direct radiator loudspeakers, in the absence of any baffling therearound, act as an acoustic dipole because the acoustic energy waves generated from one side of the speaker are in phases opposite to those of the acoustic energy waves generated from the opposite side of the speaker. A considerable efficiency results if the loudspeaker is mounted in a baffle arrangement as the sound reflected from the baffle reinforces the sound radiated outward by the loudspeaker. This is especially true for sounds which have wavelengths greater than the circumference of the loudspeaker, as such sound radiates fairly uniformly in all directions, the improvement assuming that the baffling extends for a distance from the speaker substantially larger than the wavelengths of those sounds.

As a practical matter, a baffle of adequate size for these purposes is approximated by the use of a sufficiently large enclosure in which the loudspeaker is mounted. A sufficient baffle surface will typically lead to a relatively large volume enclosure. Such enclosures typically contain several speakers for various frequency ranges typically requiring some isolation arrangement therein. Often, the enclosure also has a port provided therein to reduce loading on the back of the loudspeaker and reduce distortion for a given power while permitting a smaller enclosure with an improved output over some frequency ranges.

The various resulting structures are subject to developing resonances between the various structural members, and between them and the low frequency loudspeaker used therein. Often, the isolation between the speakers in the multiple loudspeaker enclosure is inadequate, leading to output losses. Thus, there is a desire to provide for a loudspeaker enclosure less subject to such resonances and to any other sources which would affect the fidelity of the reproduced sound while providing an enhanced performance in the bass audio range.

SUMMARY OF THE INVENTION

The present invention provides an individual enclosure for a bass loudspeaker which can be housed in a larger multiple loudspeaker enclosure, the bass loudspeaker enclosure comprising a front plate with an opening therein to permit external communication by any loudspeaker mounted thereon, a rear plate and a pair of differing diameter cylindrical shells sealed between these plates. The space between these shells is filled with a dense particulate material, such as sand. The plates can be configured to have edges thereon suitably aligned for mounting in a larger speaker enclosure.

BRIEF DESCRIPTION OF THE DRAWINGS

FIG. 2 shows a front view of the bass loudspeaker enclosure of the present invention, FIG. 3 shows a side view in partial cross section of the bass loudspeaker enclosure of the present invention, FIG. 4 shows a cross section view taken in FIG. 3, and FIG. 5 shows a side view of the multiple loudspeaker enclosure of FIG. 1 indicating the mounting of the bass loudspeaker enclosure of the present invention.

DETAILED DESCRIPTION OF THE PREFERRED EMBODIMENTS

Figure 1:
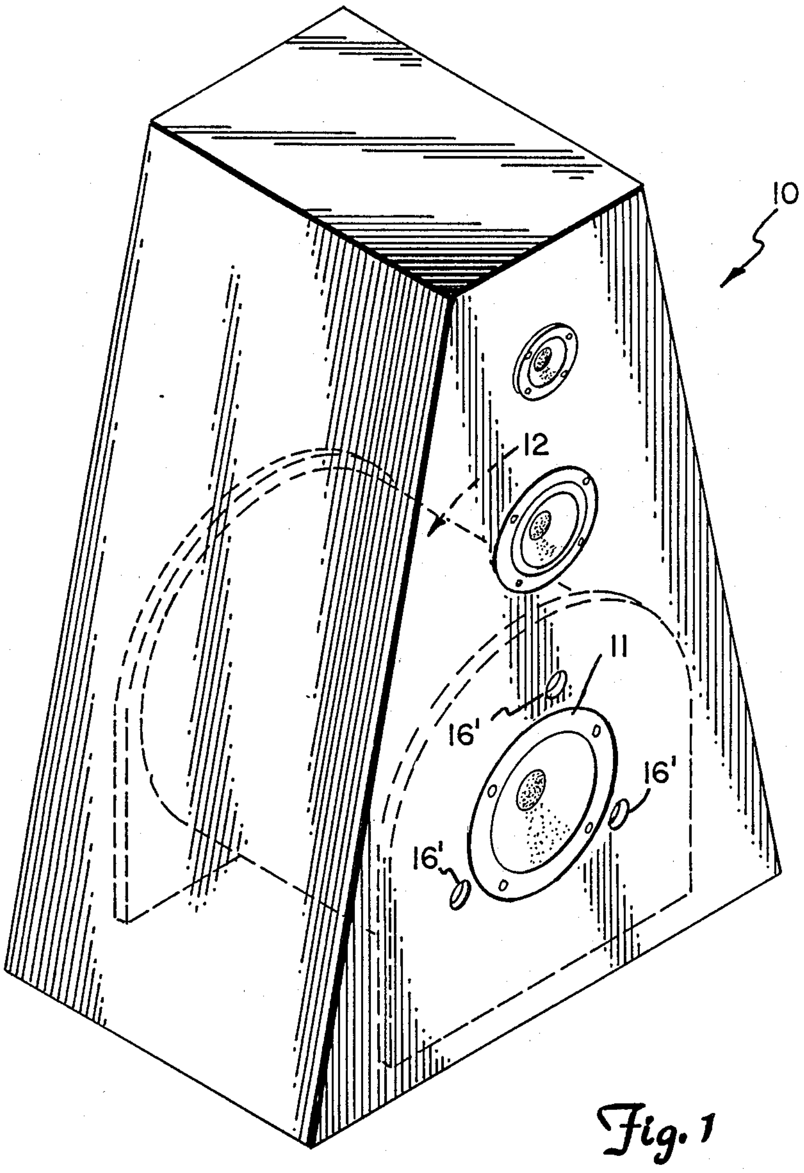
FIG. 1 shows an enclosure for multiple loudspeakers indicating the enclosed bass loudspeaker enclosure of the present invention.

FIG. 1 shows a pictorial view of a multiple loudspeaker enclosure, 10, for three direct radiation loudspeakers, each of which is intended to provide acoustic radiation in a corresponding one of three ranges of frequencies. The low frequency range is intended to be provided by a "woofer" loudspeaker, 11, which is provided in a separate bass loudspeaker enclosure, 12, shown in dashed lines in FIG. 1. Speaker 11 is mounted in a recess on the front of multiple loudspeaker enclosure 10 with suitable fasteners such as bolts extending through both speaker 11 and enclosure 10, and then through bass loudspeaker enclosure 12. A compliant material can be placed in the recess in enclosure 10 to provide some mechanical isolation between speaker 11 and enclosure 10.

The front of bass loudspeaker enclosure 12 can be seen in greater detail in the front view thereof shown in FIG. 2, but shown there with speaker 11 omitted. As can be seen there, bass loudspeaker enclosure 12 has a front plate, 13, with an upper portion having the outline of a half circle of radius 10.75 in. (for a 12.0 in. loudspeaker) and a lower portion having an outline of a rectangle of dimensions 10.75 in. by 21.50 in. smoothly joined with the upper portion. Plate 13 has therein an opening, 14, ( 11.25 in. diameter for a 12 in. speaker) concentric with the half circle outline of the upper portion of plate 13. Opening 14 is provided to permit speaker 11, if mounted on the other side of plate 13 concentric with opening 14, as is typical, to radiate acoustic energy therethrough to the outside of enclosure 12. Additionally shown are mounting holes, 15, for fasteners attaching speaker 11 to multiple loudspeaker enclosure 10 and front plate 13 of bass enclosure 12.

Three further openings, or ports, 16, are provided in front plate 13 and also shown in FIG. 2 each having a 1.125 in. diameter. Ports 16 are symmetrically positioned about speaker opening 14 by each having its center fall on a circle of 7.0 in. radius and concentric with opening 14. One of ports 16 is shown located directly vertically from opening 14 and the other two are positioned 120° on either side of the first. Each of ports 16 extends through front plate 13 to provide a passageway into the interior volume of enclosure 12. Corresponding openings, 16', are shown in the front of enclosure 10 in FIG. 1 which are aligned with ports 16 in front plate 13 of enclosure 12.

Ports 16 provide a base-reflex kind of enclosure so that each can radiate acoustically in addition to speaker 11 in an appropriate part of the bass frequency range. This use of three symmetrically positioned ports not only reduces the acoustic loading on the back of speaker 11 when mounted in enclosure 12 but more evenly distributes that loading thereacross.

Finally, the ends of eight bolt and nut arrangements, 17, are seen extending through front plate 13 into recesses in that plate provided therefor. Nut and bolt arrangements 17 are used in fastening the various components of enclosure 12 to one another as assembled.

Front plate 13 is made of a stiff, dense material such as 0.75 in. high density particle board. The lower half of plate 13 being rectangular with the lower edge thereof being flat permits enclosure 12 to be conveniently supported on the bottom of enclosure 10. Thus, even though enclosure 12 follows the shape of a truncated right circular cylinder except for the front and rear plates thereof, enclosure 12 can be stably supported on the bottom of enclosure 10 because of the provision of rectangular lower portions on these plates. However, this rectangular lower portion of front plate 12 need not necessarily be used if alternative support arrangements are made for enclosure 12.

The purpose of nut and bolt arrangements 17 can be more clearly seen in the side view of FIG. 3 shown in partial or fragmentary cross section with an upper fragment of the structure having been removed. There, front plate 13 is shown on the left. Nut and bolt arrangements 17 are shown to extend through the cylindrical shell sides of enclosure 12 to pass through a further rear plate, 18, having a shape like that of front plate 13 but without a speaker opening, speaker fastening openings, or ports provided therein. In addition to being shaped much as front plate 13 but without certain openings therein, rear plate 18 is also formed of a stiff, dense material such as 0.75 in. high density particle board. Rear plate 18 has a small opening through which interconnections for speaker 11 pass.

The sides of enclosure 12 shown in cross section in FIG. 3 are formed by a pair of cylindrical shells, including an outer shell, 19, and an inner shell, 20, both of which can also be seen in dashed line form in FIG. 2. As can be further seen, the inner sides of front plate 13 and rear plate 18, which face one another in being separated by cylindrical shells 19 and 20, have had circular grooves provided therein in which cylindrical shells 19 and 20 are fitted. Inner cylindrical shell 20 has an exterior radius of 8.25 in. while outer cylindrical shell 19 has an interior radius of 10.0 in. resulting in a space, 21, being enclosed therebetween.

Cylindrical shells 19 and 20 are desired to be made of a very stiff material but be of limited weight while being both inexpensive and strong. An excellent material is 0.25 in. wall thickness, spiral round, laminated paper tubes often used for forming concrete. Providing such laminated paper cylinders in lengths of 16.125 in. leaves the outer sides of rear and front plates 13 and 18 separated by 17.00 in. if grooves of 0.3125 in. are provided in each plate for accommodating cylindrical shells 19 and 20.

As can be seen in the cross section view of FIG. 4 taken behind front plate 13, the enclosed space between cylindrical shells 19 and 20 is formed as an annular space all around the outer circumference of inner cylindrical shell 19. This annular space is filled with a dense particulate material, such as 40 grit silica sand.

The use of stiff, dense front and rear end plates 13 and 18, and light but strong cylindrical shells 19 and 20 packed with sand therebetween, leads to a relatively rigid but massive duct enclosure for a speaker 11 when mounted on the inner surface of front plate 13. Such a massive enclosure supporting speaker 11 results in the motion of loudspeaker 11 being confined primarily to that speaker rather than also being induced in enclosure 12, and so in enclosure 10, thereby avoiding resonance in the combined structure to a considerable degree in the parts of the bass frequency range in which it is attempting to reproduce sound. Eliminating or reducing such resonance in the structure of the enclosure with the speaker mounted therein avoids having this structure provide additional acoustic energy in the bass frequency range to thereby modify the sound being reproduced by that speaker.

The resulting stiff enclosing walls of enclosure 12, resulting from the use of sand between shells 19 and 20, also avoids significant sound transmission and absorption or other detrimental interactions with the sonic energy being provided by speaker 11 to again avoid introducing unwanted effects in the sound being reproduced, and to avoid significant acoustic losses which occur through lesser isolation means. Sound absorbing material 122, can be used to line the inner side of cylindrical shell 20 and end plate 18 to absorb sonic energy at higher frequencies if desired. The cylindrical character of enclosure 12 imparted by cylindrical shells 19 and 20 reduces unwanted acoustical modes therein to again avoid unwanted sound effects and, in addition, also evens out the acoustic loading on the back of loudspeaker 11.

FIG. 5 shows a side view of enclosure 10 having enclosure 12 mounted therein. Enclosure 12 is mounted against the front side of enclosure 10 while having the lower flat edges of the rectangular lower portions of front and rear plates 13 and 18 resting on the bottom of enclosure 10. In this manner, enclosure 19 separates speaker 11 mounted therein from remaining portions of enclosure 10.

Although the present invention has been described with reference to preferred embodiments, workers skilled in the art will recognize that changes may be made in form and detail without departing from the spirit and scope of the invention.

What is claimed is:

1. An isolating enclosure for retaining a loudspeaker to be mounted in a loudspeaker housing to reduce unwanted effects of said loudspeaker relative to said housing, said enclosure comprising:

a stiff front plate having a loudspeaker opening therein at which said loudspeaker can be mounted on an interior side thereof to be capable of directing sound energy therethrough;

a stiff rear plate having an interior side; and a pair of stiff cylindrical tubes including an outer tube positioned substantially concentrically about an inner tube and together sealed between said interior sides of said front and rear plates with said inner tube being sufficiently smaller than said outer tube so as to leave a tube enclosed space therebetween, said tube enclosed space being substantially filled with dense particulate matter.

2. The apparatus of claim 1 wherein said front plate has portions thereof with edge portions substantially aligned in a common plane.

3. The apparatus of claim wherein said particulate matter is sand.

4. The apparatus of claim 1 wherein said front plate has a plurality of openings therein positioned outside said speaker opening and positioned symmetrically thereabout.

5. The apparatus of claim 1 wherein an interior of said inner tube has a sound absorbing material provided therein.

6. The apparatus of claim 2 wherein said rear plate has portions thereof with edge portions substantially aligned in a common plane.

7. The apparatus of claim 6 wherein each of said front and rear plates having said edge thereof portions substantially aligned in a common plane.

* * * * *

UNITED STATES PATENT AND TRADEMARK OFFICE
CERTIFICATE OF CORRECTION

PATENT NO. : 4,924,964
DATED : May 15, 1990
INVENTOR(S) : Michael P. Olsen

It is certified that error appears in the above-identified patent and that said Letters Patent is hereby corrected as shown below:

Column 4, line 53, delete "claim" and insert --claim 1--.

Column 4, line 68, delete "thereof portions" and insert --portions thereof--.

Signed and Sealed this

Sixth Day of August, 1991

*Attest:*

HARRY F. MANBECK, JR.

*Attesting Officer*

*Commissioner of Patents and Trademarks*